United States Patent [19]

Mahler

[11] Patent Number: 4,595,483

[45] Date of Patent: Jun. 17, 1986

[54] CATHODE SPUTTERING APPARATUS WITH ADJACENTLY ARRANGED STATIONS

[75] Inventor: Peter Mahler, Hainburg, Fed. Rep. of Germany

[73] Assignee: Leybold Hearaeus GmbH, Cologne, Fed. Rep. of Germany

[21] Appl. No.: 716,854

[22] Filed: Mar. 28, 1985

[30] Foreign Application Priority Data

Apr. 6, 1984 [DE] Fed. Rep. of Germany ....... 3413001

[51] Int. Cl.$^4$ .............................................. C23C 15/00
[52] U.S. Cl. .................................. 204/298; 204/192 R
[58] Field of Search ............................. 204/298, 192 R

[56] References Cited

U.S. PATENT DOCUMENTS

| 4,336,438 | 6/1982 | Uehara et al. | 204/298 |
| 4,388,034 | 6/1983 | Takahashi | 204/298 |
| 4,444,643 | 4/1984 | Garrett | 204/298 |
| 4,450,062 | 5/1984 | Macauley | 204/298 |
| 4,482,419 | 11/1984 | Tsukada et al. | 204/298 |
| 4,500,407 | 2/1985 | Boys et al. | 204/298 |
| 4,547,247 | 10/1985 | Warenback | 204/298 |
| 4,548,699 | 10/1985 | Hutchinson et al. | 204/298 |

FOREIGN PATENT DOCUMENTS

| 2932438 | 2/1981 | Fed. Rep. of Germany . | |
| 2135700 | 9/1984 | United Kingdom | 204/298 |

*Primary Examiner*—Arthur P. Demers
*Attorney, Agent, or Firm*—Felfe & Lynch

[57] ABSTRACT

Cathode sputtering apparatus with at least two adjacently arranged stations including a charging station and a coating station. At least one sputtering cathode and a substrate carrier that can execute reciprocatory movement between the stations are arranged on a vacuum chamber. The substrate carrier is secured by means of an extension arm eccentrically on a pivot bearing passing through the vacuum chamber. A coolant circulation line is led through the pivot bearing to the substrate holder.

7 Claims, 5 Drawing Figures

CATHODE SPUTTERING APPARATUS WITH ADJACENTLY ARRANGED STATIONS

This invention relates to cathode sputtering apparatus with at least two adjacently arranged stations including a charging station and a coating station, and with a vacuum chamber, at least one sputtering cathode, and a substrate holder able to execute reciprocal movement between the stations.

With such a cathode sputtering unit the charging station may coincide with an etching station so that the unit overall consists of only two stations.

A cathode sputtering unit with three stations is known from German published patent application DE-OS No. 29 32 483, in which a corresponding number of substrate holders is arranged on a circular disc that can rotate about a concentric axis in the manner of a carousel. In this unit, however, no coolant circulation is provided for the individual substrate holders, with the result that it is practically impossible to maintain a specific temperature level during the individual treatment procedures. Furthermore, with such types of units it is practically impossible to avoid cross-contamination between the individual stations since it is not possible for structural reasons to install air-lock valves between the individual stations, In particular, it is also not possible, for example, to open the charging station and at the same time operate the adjacent coating station.

Cathode sputtering units composed of so-called module units also belong to the state of the art. In this case several stations are separated each by its own vacuum chamber, and a series arrangement of such vacuum chambers is sealed off with respect to the atmosphere by air-lock valves between the chambers as well as at both ends of the unit. A semi-continuous mode of operation is possible with such an arrangement, and also cross-contamination is prevented by the air-lock valves. The substrates are passed linearly through all the stations by means of plate-shaped substrate carriers mounted on rollers. However, it is difficult to cool the substrate sufficiently since it is not possible, for example on account of the air-lock valves, to maintain the movable substrate holders permanently connected up to a coolant circulation. With such units one has, therefore, had to resort to placing the substrate holders in the individual stations on stationary cooling plates. Such a method of cooling is, however, inadequate for certain heat-sensitive products, and in particular is virtually unreproducible.

As regards the question of substrate cooling, it may be mentioned that substrates that have to be kept very strictly at a specific temperature are bonded by means of a heat-conducting composition to the substrate holder so as to ensure a good heat transfer between these components. However, a very weak 'link' in the heat conduction chain is formed as a result of placing a movable substrate holder on stationary cooling plates provided with a coolant circulation, i.e. the heat transfer conditions between the substrate holder and the cooling are not reproducible, and the result is a relatively high temperature gradient. The interruption in the heat conduction due to a more or less narrow air gap is particularly critical if two treatment procedures that both involve a thermal loading or stress of the substrate directly follow one another in adjacent stations.

Thermal stress of the substrate is particularly unavoidable in so-called plasma processes that form the basis of a cathode sputtering procedure as well as a plasma etching procedure. In this connection, the thermal stress with so-called diode systems is greater on account of the longer duration of the procedure, than in so-called magnetron cathodes, in which the plasma discharge is limited to a narrow region of the cathode and target surfaces. The thermal stress is less simply on account of the substantially shorter coating time, in which the sputtering rate is greater by a factor of 10 to 30. However, for numerous processes in which a high layer uniformity is an important feature such magnetron cathodes cannot be used, or can be used only under complicated operating conditions, on account of the spatially and locally restricted sputtering procedure, so that in these cases too the so-called diode sputtering is used as before. A diode process is also involved in so-called plasma etching, in which the substrate holder together with the substrates is insulated with respect to the vacuum chamber and is connected to a high frequency generator. In this case the sputtering direction is reversed and the material to be stripped form the substrates by the etching process migrates in the direction of a collection plate in the etching station. This procedure too is associated with a high thermal stress of the substrate since the plasma discharge acts in this case directly on the substrate surface. In principle it is also possible to perform etching under the action of a magnetic field, though in practice the so-called diode processes predominate for reasons of uniformity.

An object of the invention is, therefore, to improve substantially a cathode sputtering apparatus so that the substrates can be constantly cooled under reproducible conditions during their path through the individual stations.

This objective is achieved in accordance with the invention by virtue of the fact that the substrate holder is secured by means of an extension arm eccentrically to a pivot bearing passing through the vacuum chamber, and that a coolant circulation is led through the pivot bearing to the substrate carriers.

By means of the measure according to the invention, the conventional linear movement of the substrate carrier in cathode sputtering units is replaced by a pivoting movement on a circular path around the pivot bearing, and the pivot bearing can be used to connect the substrate holder permanently to the coolant source. In this case it is possible to keep the substrate holder permanently cooled not only in all the stations but also during its path from one station to another station and thereby maintain the intimate thermal contact between the substrates and the substrate holder and coolant circulation, for example by means of a heat-conducting composition.

According to a further embodiment of the invention, it is particularly advantageous if the substrate holder is mounted in an insulated manner with respect to the vacuum chamber and is connected to a high frequency generator.

In such a case the charging station can be used in a particularly simple way as an etching station. By applying a high frequency to the substrate holder and by virtue of the surface ratio of the substrate holder to the opposite wall surfaces of the charging station, the latter effectively become the anode and the substrates can be etched by the resultant plasma process. In particular, the charging cover can assume the function of the anode and serve as a suspension means for the etched material. To this end, the charging cover is preferably provided with a replaceable plate.

It is also particularly advantageous if the vacuum chamber is in the form of a parallelepiped and has two circular recesses in its upper chamber wall, one of which can be closed by the sputtering cathode and the other of which can be closed by the already described charging cover, and if the axis of the pivot bearing lies in a vertical plane of symmetry running between the recesses.

Such a measure enables the substrate holder in the charging station to be lightly coated from above by swinging the charging cover sideways. Parts of the unit are also readily accessible in the coating station after dismantling the sputtering cathode.

By means of the invention the substrates can also be kept permanently cooled in a particularly simple manner by separating the individual stations by means of a valve.

According to a further embodiment of the invention, this is achieved if a partition with a valve seat and a first valve closure is arranged between the two stations, and if the extension arm has a second valve closure that can be brought into position on the valve seat by swinging the substrate carrier into the coating station.

In this case the substrate carrier additionally has the function of a valve, it being assumed of course that the first valve closure is moved into a position that does not hinder the second valve closure. The coolant circulation can thus be maintained in an uninterrupted manner, and cross-contamination between the individual treatment stations is absolutely avoided.

In accordance with the invention, cathode sputtering apparatus comprises a vacuum chamber and at least two adjacently arranged stations including a charging station and a coating station. The apparatus also includes at least one sputtering cathode means, a substrate holder able to execute reciprocal movement between the stations, and a pivot bearing passing through the vacuum chamber. The apparatus also includes an extension arm on the pivot bearing. The substrate holder is secured by means of the extension arm eccentrically on the pivot bearing. The apparatus also includes coolant circulation means led through the pivot bearing to the substrate holder.

For a better understanding of the invention, together with other and further objects thereof, reference is made to the following description, taken in connection with the accompanying drawings, and its scope will be pointed out in the appended claims.

Referring now to the drawings.

Figure 1:
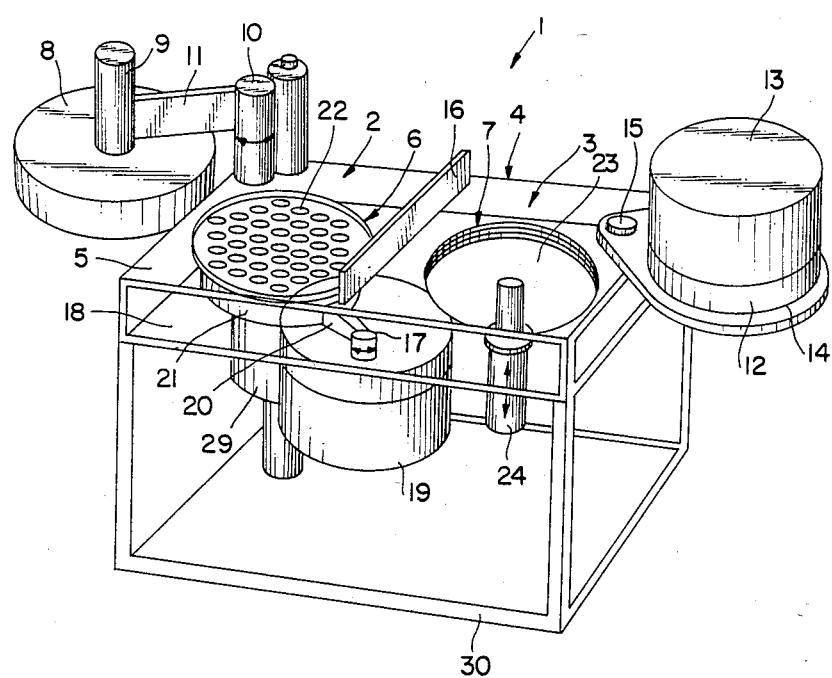
FIG. 1 is a perspective view of cathode sputtering apparatus with two stations, showing both the charging cover and the sputtering cathode swung outwardly.

FIG. 1 represents a cathode sputtering unit 1 with two adjacent stations 2 and 3, of which the station 2 preferably is simultaneously a charging station and etching station, while station 3 is a coating station. These stations preferably constitute part of a parallelepiped vacuum station 4 whose upper chamber wall 5 preferably has two circular recesses 6 and 7. One of them can be closed by a charging cover 8, which preferably can be swung sideways by means of a lifting drive 9 and a rotary drive 10 via a lever arm 11.

The other circular recess 7 can be closed by a sputtering cathode 12 preferably arranged together with its impedance matching supply 13 on a sealing flange 14 that can pivot about an eccentric shaft 15.

With regard to the recesses 6 and 7 one can imagine a vertical plane of symmetry between these recesses that preferably runs roughly through the cross arm 16 serving to reinforce the upper chamber wall 5. The vertical shaft of a pivot bearing 17 passing in an insulated manner through the lower chamber wall 18 of the vacuum chamber 4 preferably is arranged in this plane of symmetry. The lower end of the pivot bearing is not visible here, but is situated in a housing 19 accommodating a further impedance matching supply.

A radial extension arm 20 connected to a substrate holder 21 preferably is secured to the pivot bearing 17. The substrate holder 21 is located in the illustrated case coaxially underneath the recess 6, the individually applied substrates 22 being visible. If the charging cover 8 is now swung in a counter-clockwise direction over the recess 6 and then lowered to produce a vacuum-tight connection, an etching process can be performed in the station 2, for which the high frequency generator connected to the pivot bearing 17 provides the necessary energy.

After this etching process the substrate holder 21 can be swung so far in a clockwise direction by means of the pivot bearing 17 that it comes to rest coaxially underneath the recess 7. With the sputtering cathode 12 swung inwardly it is possible to perform a coating operation on the substrate 22 in this position.

In the present case a circular disc 23 can also be seen in the recess 7, which serves as a pre-sputtering plate. Impurities from the surface of the sputtering cathode 12 can be deposited on this circular disc at the beginning of the coating procedure. In order to free the path for the substrate holder 21, the circular disc 23 preferably is secured to a lifting drive 24 with which the circular disc can be lowered so that the substrate holder 21 can be moved into position exactly above the circular disc.

Figure 2:
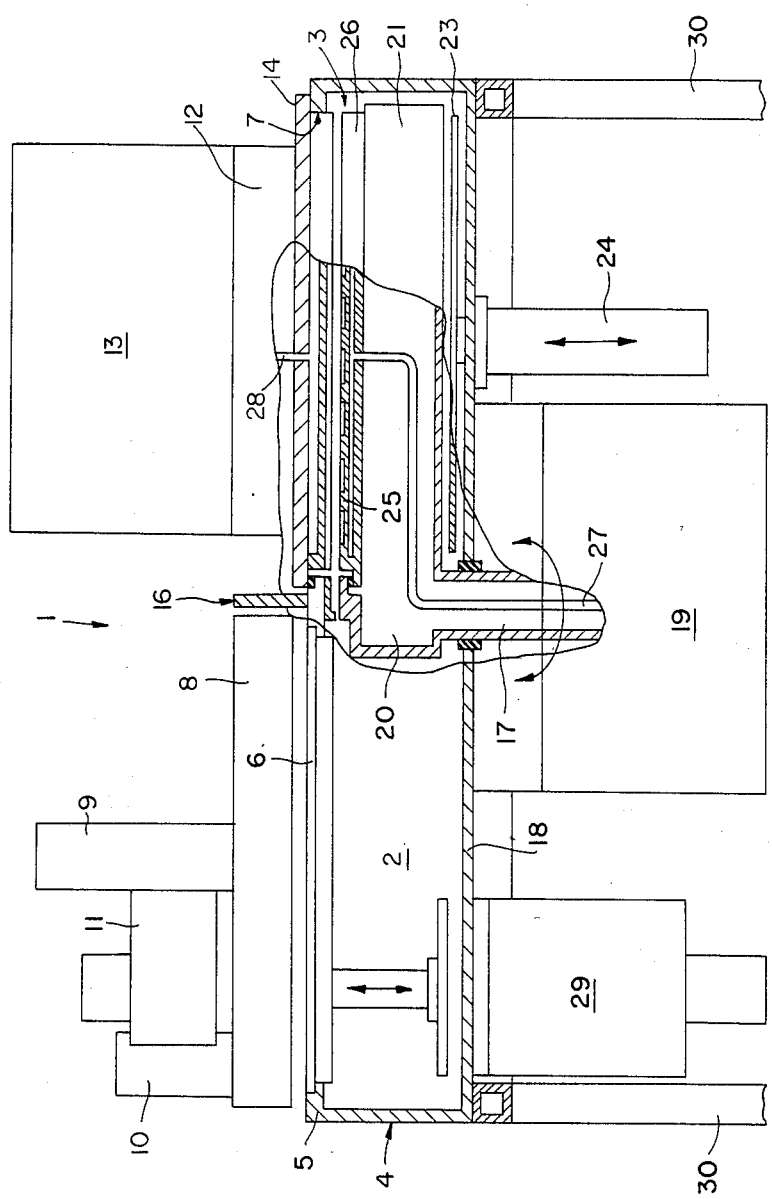
FIG. 2 is a partial section through the apparatus of FIG. 1, though with the charging cover and sputtering cathode swung into position during the coating procedure, in which the substrate holder is situated beneath the sputtering cathode.

In FIG. 2 the same parts as in FIG. 1 are provided with the same reference numerals. It should be remembered in connection with FIG. 1 that the substrate holder 21 is formed as an essentially cylindrical hollow body in which a supporting plate 26 provided with cooling channels 25 is mounted on its upper side. This supporting plate has a number of circular disc-shaped recesses which are provided for positioning the substrates 22 in a position according to FIG. 1. A coolant circulation means 27, which is here symbolized only by a double branched line but which of course preferably comprises two lines for inflow and recycle, leads from the cooling channels 25 either to a heat exchanger or to an outflow. The term "coolant circulation" is understood to mean any passage of a liquid coolant through the substrate carrier 21.

It can be seen that the coolant circulation means 27 is passed through the pivot bearing 17. It can also be seen that the circular disc 23 is illustrated in a lowered position relative to FIG. 1 so that there is sufficient space between it and the recess 7 to swing the substrate holder 21 in. The underneath of the sputtering cathode 12 comprises a target plate of the coating material to be sputtered, and in addition the surface of this target plate preferably is aligned parallel to the supporting plate 26. The sputtering cathode 12 preferably is also connected to a coolant circulation means 28, of which only one branch is shown.

A suction pipe 29 for evacuating the system as well as a supporting frame 30 are also represented in FIGS. 1 and 2.

Figure 3:
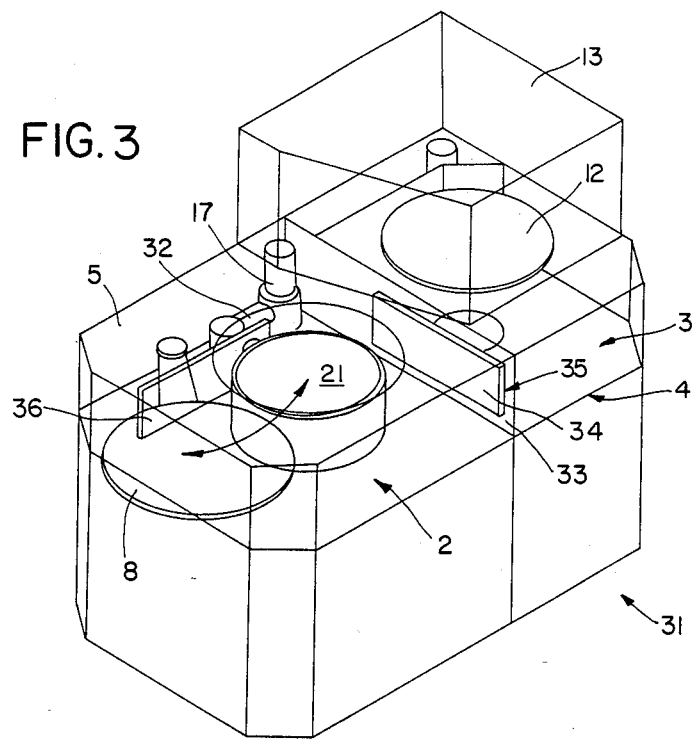
FIG. 3 is a perspective view of another embodiment of the invention, in which the two stations can be mutually sealed off by a partition with a valve.
Figure 4:
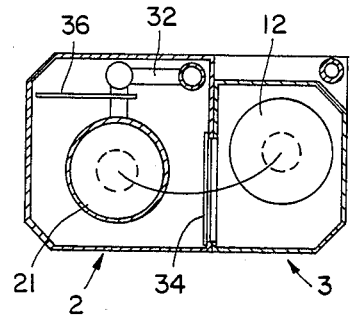
FIGS. 4 and 5 are plan views, partly in section and partly diagrammatic, of the FIG. 3 embodiment showing two possible views of substrate holder and valve closure.
Figure 5:
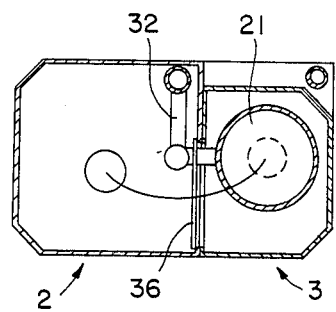

FIG. 3 shows a cathode sputtering unit 31 modified with respect to FIGS. 1 and 2, and also with two stations 2 and 3 performing the same function as in FIG. 1. The charging cover 8 and the sputtering cathode 12 are represented only diagrammatically. In the present case a differently shaped extension arm 32 bent into an angle and situated in a horizontal plane (FIGS. 4 and 5) preferably is provided for connecting the substrate holder 21 to the pivot bearing 17 and for passage of the coolant circulation. A partition 33 with a first valve closure 34 preferably formed by a rectangular plate is situated between the two stations 2 and 3. This valve closure cooperates with a valve seat 35 whose contour roughly corresponds to the contour of the valve closure 34. A second valve closure 36 congruent to the first valve closure 34 preferably is secured in such a spatial position on the bent extension arm 32 that it comes to rest in a vacuum-tight manner on the valve seat 35 when the substrate holder 21 is swung from the station 2 (FIG. 4) into the station 3 (FIG. 5). Any cross-contamination between the stations 2 and 3 is thereby excluded.

It can be seen that the bent extension arm 32 passes through the second valve closure 36. Consequently the coolant circulation is also passed through the second valve closure so that the coolant circulation can be maintained in both station 2 and station 3 as well as during transportation between the two stations. The transportation movement is symbolized by the two circular arcs in FIGS. 4 and 5.

Heat-conducting substances include, for example, low melting point metals (gallium, m.p.=28.6° C.) or alloys (indium/gallium, m.p.=15.9° C.), as well as organic pastes to which good heat-conducting metal powders (silver or aluminum) have been added.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Cathode sputtering apparatus comprising:
    a vacuum chamber;
    at least two adjacently arranged stations including a charging station and a coating station;
    at least one sputtering cathode means;
    a substrate holder able to execute reciprocal movement between said stations;
    a pivot bearing passing through said vacuum chamber;
    an extension arm on said pivot bearing;
    said substrate holder being secured by means of said extension arm eccentrically on said pivot bearing; and
    coolant circulation means led through said pivot bearing to said substrate holder.

2. Cathode sputtering apparatus according to claim 1, which includes a supporting plate provided with cooling channels and in which said substrate holder is formed as an essentially cylindrical hollow body having an upper side in which said supporting plate provided with cooling channels is mounted.

3. Cathode sputtering apparatus according to claim 1, which includes a high frequency generator and in which said substrate holder is mounted insulated with respect to said vacuum chamber and is coupled to said high frequency generator.

4. Cathode sputtering apparatus according to claim 1, which includes a charging cover and in which said vacuum chamber is parallelepiped-shaped and has an upper chamber wall having therein two circular recesses, one of which can be closed by said sputtering cathode means and the other of which can be closed by said charging cover, and in which said recesses have a vertical plane of symmetry therebetween, the axis of said pivot bearing lying in said vertical plane of symmetry running between said recesses.

5. Cathode sputtering apparatus according to claim 4, which includes a circular disc which can be raised and lowered as a pre-sputtering plate underneath said one of said recesses which can be closed by said sputtering cathode means.

6. Cathode sputtering apparatus according to claim 1, which includes a partition with a valve seat and a first valve closure arranged between said two stations and in which said extension arm has a second valve closure that can be brought to rest on said valve seat by swinging said substrate holder into said coating station.

7. Cathode sputtering apparatus according to claim 6, in which said extension arm is formed with an angle in a horizontal plane.

* * * * *